(12) United States Patent
Pandey

(10) Patent No.: US 10,393,514 B2
(45) Date of Patent: Aug. 27, 2019

(54) TOPOGRAPHY MEASUREMENT SYSTEM

(71) Applicant: ASML Netherlands B.V., Veldhoven (NL)

(72) Inventor: Nitesh Pandey, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/764,661

(22) PCT Filed: Sep. 5, 2016

(86) PCT No.: PCT/EP2016/070873
§ 371 (c)(1),
(2) Date: Mar. 29, 2018

(87) PCT Pub. No.: WO2017/060014
PCT Pub. Date: Apr. 13, 2017

(65) Prior Publication Data
US 2018/0283853 A1    Oct. 4, 2018

(30) Foreign Application Priority Data
Oct. 8, 2015  (EP) .................................... 15188936

(51) Int. Cl.
*G03F 7/20* (2006.01)
*G03F 9/00* (2006.01)
(Continued)

(52) U.S. Cl.
CPC ...... *G01B 11/2513* (2013.01); *G01B 11/0608* (2013.01); *G01B 11/24* (2013.01);
(Continued)

(58) Field of Classification Search
None
See application file for complete search history.

(56) References Cited

U.S. PATENT DOCUMENTS 5,191,200 A  *  3/1993  van der Werf ....... G02B 21/241
250/201.4
5,414,515 A      5/1995  Kawashima
(Continued)

FOREIGN PATENT DOCUMENTS

DE       4230108 A1    3/1994
JP    H05-129182 A    5/1993
(Continued)

OTHER PUBLICATIONS

International Search Report and Written Opinion of the International Searching Authority directed to related International Patent Application No. PCT/EP2016/070873, dated Jan. 4, 2017; 12 pages.
(Continued)

*Primary Examiner* — Shawn Decenzo
(74) *Attorney, Agent, or Firm* — Sterne, Kessler, Goldstein & Fox P.L.L.C.

(57) ABSTRACT

Measurement system comprising a radiation source configured to generate a measurement radiation beam, a polarizer and a grating to receive the measurement radiation beam and provide a polarized measurement radiation beam patterned by the grating, optics to form an image of the grating at a target location on a substrate. The image comprises a first part having a first polarization and a second part having a second polarization, detection optics to receive radiation from the target location of the substrate and form an image of the grating image at a second grating, and a detector to receive radiation transmitted through the second grating and produce a two output signal indicative of the intensity of the transmitted radiation for the first and second parts of the grating image respectively. Topography of the substrate can be determined from the signals.

15 Claims, 6 Drawing Sheets

(51) Int. Cl.
  *G01B 11/06* (2006.01)
  *G01B 11/24* (2006.01)
  *G01B 11/25* (2006.01)

(52) U.S. Cl.
  CPC ........ *G03F 7/70625* (2013.01); *G03F 9/7034* (2013.01); *G01B 2210/56* (2013.01)

(56) References Cited

U.S. PATENT DOCUMENTS

| | | | |
|---|---|---|---|
| 5,633,721 A | | 5/1997 | Mitzutani |
| 7,079,666 B2* | | 7/2006 | Coulombe ........... G06K 9/2036 |
| | | | 348/136 |
| 8,553,227 B2 | | 10/2013 | Jordanoska |
| 9,658,528 B2 | | 5/2017 | Kmijt-Stegeman et al. |
| 10,036,630 B1* | | 7/2018 | Sze .................... G01B 11/2527 |
| 2004/0130731 A1* | | 7/2004 | Yamaguchi ............ G01B 11/25 |
| | | | 356/610 |
| 2005/0274909 A1 | | 12/2005 | Teunissen et al. |
| 2006/0126074 A1 | | 6/2006 | Van Der Werf et al. |
| 2007/0181827 A1* | | 8/2007 | Tempelaars ........... G03F 9/7011 |
| | | | 250/492.1 |
| 2008/0117438 A1* | | 5/2008 | Quirion ................. G01B 11/25 |
| | | | 356/610 |
| 2008/0204740 A1 | | 8/2008 | Berg et al. |
| 2009/0180182 A1 | | 7/2009 | Kim |
| 2010/0321773 A1 | | 12/2010 | Chen et al. |
| 2011/0063625 A1* | | 3/2011 | Zettler .................. G01B 11/25 |
| | | | 356/612 |
| 2012/0008150 A1* | | 1/2012 | Smith ................ G01B 11/0608 |
| | | | 356/616 |
| 2015/0070472 A1* | | 3/2015 | Chen .................. G01B 11/2531 |
| | | | 348/47 |
| 2015/0116729 A1* | | 4/2015 | Smith ................ G01B 11/0608 |
| | | | 356/610 |
| 2015/0145172 A1 | | 5/2015 | Kruijt-Stegeman et al. |
| 2015/0260510 A1* | | 9/2015 | Nakajima .......... G01B 11/2513 |
| | | | 348/136 |
| 2015/0276388 A1* | | 10/2015 | Akita ..................... G01B 11/24 |
| | | | 356/364 |
| 2017/0048494 A1* | | 2/2017 | Boyle .................. H04N 5/2256 |
| 2017/0244876 A1* | | 8/2017 | Ida ............................ G06K 9/52 |
| 2017/0343338 A1* | | 11/2017 | Hamaguchi ............ G01B 11/25 |

FOREIGN PATENT DOCUMENTS

| | | |
|---|---|---|
| JP | 2004-304086 A | 10/2004 |
| JP | 2006-113583 A | 4/2006 |
| JP | 2009-200466 A | 9/2009 |
| JP | 2011-097051 A | 5/2011 |
| JP | 2013-236074 A | 11/2013 |
| JP | 2014-229803 A | 12/2014 |

OTHER PUBLICATIONS

International Preliminary Report on Patentability directed to related International Patent Application No. PCT/EP2016/070873, dated Apr. 10, 2018; 9 pages.

Japanese Search Report by Registered Search Organization with English-language Translation attached directed to related Japanese Patent Application No. 2018-531407 A, dated Apr. 23, 2019; 40 pages.

Notice of Reason's for Refusal Organization with English-language Translation attached directed to related Japanese Patent Application No. 2018-531407 A, dated May 8, 2019; 10 pages.

* cited by examiner

TOPOGRAPHY MEASUREMENT SYSTEM

CROSS-REFERENCE TO RELATED APPLICATIONS

This application claims priority of EP application 15188936.7 which was filed on 8 Oct. 2015 and which is incorporated herein in its entirety by reference.

FIELD

The present invention relates to a topography measurement system and method. The topography measurement system may form part of a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate (e.g. a silicon wafer).

Before a pattern is projected from a patterning device onto a layer of radiation sensitive material provided on a substrate the topography of the substrate is measured. In order to achieve this, the lithographic apparatus is provided with a topography measurement system. The topography measurement system measures the height of the substrate across the surface of the substrate. The height measurements are used to form a height map which assists accurate projection of a pattern onto the substrate.

It may be desirable to provide, for example, a topography measurement system which obviates or mitigates one or more of the problems of the prior art, whether identified herein or elsewhere.

SUMMARY

According to a first aspect of the invention, there is provided a topography measurement system comprising a radiation source configured to generate a measurement radiation beam, a polarizer and a grating configured to receive the measurement radiation beam and provide a polarized measurement radiation beam patterned by the grating, optics configured to form an image of the grating at a target location on a substrate, the grating image comprising a first part having a first polarization and a second part having a second different polarization, detection optics configured to receive radiation reflected from the target location of the substrate and form an image of the grating image at a second grating, a detector configured to receive radiation transmitted through the second grating and produce a first output signal indicative of the intensity of the transmitted radiation for the first part of the grating image and produce a second output signal indicative of the intensity of the transmitted radiation for the second part of the grating image, and a processor configured to analyse the output signals and determine the topography of the substrate from the independent output signals.

Detecting each part of the grating image separately provides an effective reduction of the size of the target location illuminated on the substrate by the measurement beam. This increases the spatial sampling frequency of the topography measurement system. Using first and second different polarizations is advantageous because it allows polarization dependent measurement errors to be identified and compensated for.

The second polarization may be orthogonal to the first polarization.

The polarizer and the grating may be provided in the form of a polarizing grating. Alternatively the polarizer and the grating may be provided as separate entities.

The polarized measurement radiation beam may be incident upon the substrate with an angle of incidence of between 75° and 85°.

Increasing the angle of incidence (compared with a 70° angle of incidence as is conventionally used) is advantageous because it reduces the impact of substrate layer structure upon the reflection of the polarized measurement radiation beam.

The angle of incidence may be around 80°.

The grating may comprise a wire grid polarizer.

The combination of the wire grid polarizer and the detector which provides separate output signals for separate grating image parts is advantageous because it is relatively inexpensive. A further advantage is that the combination can be retro-fitted to existing topography measurement systems.

The wire grid polarizer may comprise two mutually orthogonal polarizing sections.

The mutually orthogonal polarizing sections may be substantially equal in area.

The detector may comprise two independent regions configured such that one detector region receives radiation from the first part of the grating image and the other detector region receives radiation from the second part of the grating image.

The first and second output signals may be assigned mathematical weights by the processor.

The assigned mathematical weights may be used to adjust a polarization ratio of the measurement radiation beam.

The measurement radiation beam may be one of a plurality of measurement radiation beams, and the assigned mathematical weights may be used to correct for a polarization imbalance between the measurement radiation beams.

The measurement radiation beam may comprise broadband ultraviolet radiation.

According to a second aspect of the invention there is provided a topography measurement method comprising polarizing and patterning a measurement radiation beam using a polarizer and a grating, forming an image of the grating on a substrate, the grating image comprising a first part having a first polarization and a second part having a second different polarization, forming an image of the grating image at a second grating, detecting the intensity of the first part of the grating image as transmitted by the second grating and detecting the intensity of the second part of the grating image as transmitted by the second grating, and analysing the detected intensities to determine the topography of the substrate.

The second polarization may be orthogonal to the first polarization.

The polarizer and the grating may be provided in the form of a polarizing grating. Alternatively the polarizer and the grating may be provided as separate entities.

The measurement radiation beam may be incident upon the substrate with an angle of incidence of between 75° and 85°.

The angle of incidence may be around 80°.

The detected intensities may be assigned mathematical weights.

The assigned mathematical weights may be used to adjust a polarization ratio of the measurement radiation beam.

The measurement radiation beam may be one of a plurality of measurement radiation beams, and wherein the assigned mathematical weights may be used to correct for a polarization imbalance present between different measurement radiation beams.

The measurement radiation beam may comprise broadband ultraviolet radiation.

According to a third aspect of the invention there is provided a lithographic apparatus comprising an illumination system configured to condition a radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of the substrate, wherein the lithographic apparatus further comprises a topography measurement system comprising a radiation source configured to generate a measurement radiation beam, a polarizer and a grating configured to receive the measurement radiation beam and provide a polarized measurement radiation beam patterned by the grating, optics configured to form an image of the grating at a target location on a substrate, the grating image comprising a first part having a first polarization and a second part having a second different polarization, detection optics configured to receive radiation reflected from the target location of the substrate and form an image of the grating image at a second grating, a detector configured to receive radiation transmitted through the second grating and produce a first output signal indicative of the intensity of the transmitted radiation for the first part of the grating image and produce a second output signal indicative of the intensity of the transmitted radiation for the second part of the grating image, and a processor configured to analyse the first and second output signals and determine the topography of the substrate from the independent output signals.

The second polarization may be orthogonal to the first polarization.

BRIEF DESCRIPTION OF THE DRAWINGS

Embodiments of the invention will now be described, by way of example only, with reference to the accompanying schematic drawings, in which.

DETAILED DESCRIPTION

Figure 1:
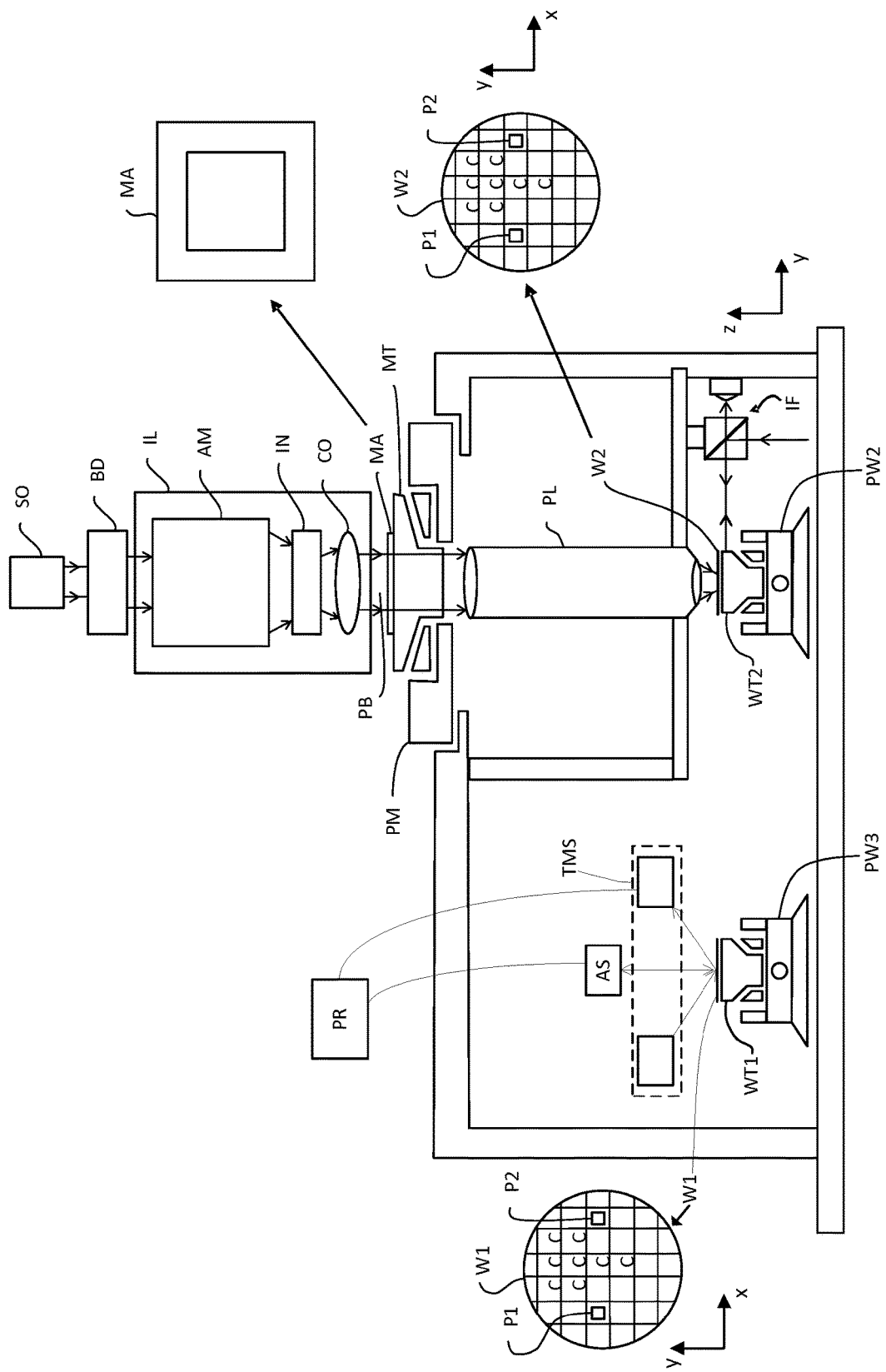
FIG. 1 schematically depicts a lithographic system comprising a topography measurement system according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure holds the patterning device. It holds the patterning device in a way that depends on the orientation of the patterning device, the design of the lithographic apparatus, and other conditions, such as, for example, whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" used herein may encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus comprising a topography measurement system according to a particular embodiment of the invention. The apparatus comprises:

a. an illumination system IL to condition a beam PB of radiation (e.g. DUV radiation or EUV radiation).
b. a support structure (which may be referred to as a mask table) MT to support a patterning device (e.g. a mask) MA and connected to first positioning device PM to accurately position the patterning device with respect to item PL;
c. a substrate table (which may be referred to as a wafer table) WT2 for holding a substrate (e.g. a resist coated wafer) W2 and connected to second positioning device PW2 for accurately positioning the substrate with respect to item PL;
d. another substrate table WT1 for holding a substrate W1 and connected to third positioning device PW3 for accurately positioning the substrate with respect to alignment system AS and topography measurement system TMS; and
e. a projection system (e.g. a refractive projection lens) PL configured to image a pattern imparted to the radiation beam PB by patterning device MA onto a target portion C (e.g. comprising one or more dies) of the substrate W2.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the lens PL, which focuses the beam onto a target portion C of the substrate W2. With the aid of the second positioning device PW2 and position sensor IF (e.g. an interferometric device), the substrate table WT2 can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed.

The lithographic apparatus may for example move the patterning device MA and the substrate W2 with a scanning motion when projecting the pattern from the patterning device onto a target portion C. Cartesian coordinates are indicated in FIG. 1. As is conventional, the z-direction corresponds with an optical axis of the radiation beam PB. In an embodiment in which the lithographic apparatus is a scanning lithographic apparatus, the y-direction corresponds with the direction of scanning motion.

As depicted, the lithographic apparatus may be of a type having two (dual stage) or more substrate tables WT1, WT2. In a dual stage lithographic apparatus two substrate tables WT1, WT2 are provided in order to allow properties of one substrate W1 to be measured whilst exposure of another substrate W2 is taking place ("exposure of a substrate" means projection of patterned radiation onto the substrate as described above).

In the dual stage lithographic apparatus depicted in FIG. 1 an alignment system AS is provided on the left-hand side of the figure. A topography measurement system TMS is also provided on the left-hand side of the figure. The projection system PL is provided on the right-hand side of the figure. The alignment system AS measures the positions of alignment marks provided on a substrate W1 (schematically depicted by boxes P1, P2) which is held on a first substrate table WT1. The topography measurement system TMS measures the topography of the substrate W1. A pattern is simultaneously projected by the projection system PL onto a substrate W2 held on a second substrate table WT2. When measurement of the substrate W1 supported by the first substrate table WT1 is completed and exposure of the substrate W2 supported by the second substrate table WT2 is completed, the positions of the substrate tables are swapped over. The substrate W1 supported by the first substrate table WT1 is then exposed using patterned radiation projected by the projection system PL. The already exposed wafer W2 supported by the second substrate table WT2 is removed from the substrate table for subsequent processing. Another substrate is then placed on the second substrate table WT2 for measurement by the alignment system AS and the topography measurement system TMS prior to exposure using patterned radiation projected by the projection system PL.

An interferometer (not depicted) and/or other position measurement means may be used to monitor the position of the substrate table WT1 during alignment and topography measurements. A processor PR may receive data from the alignment system AS, the topography measurement system TMS and also receive substrate table WT1 position information. Since the substrate W is fixed on the substrate table WT1, position information relating to the substrate table may be taken as being position information relating to the substrate.

Figure 2:
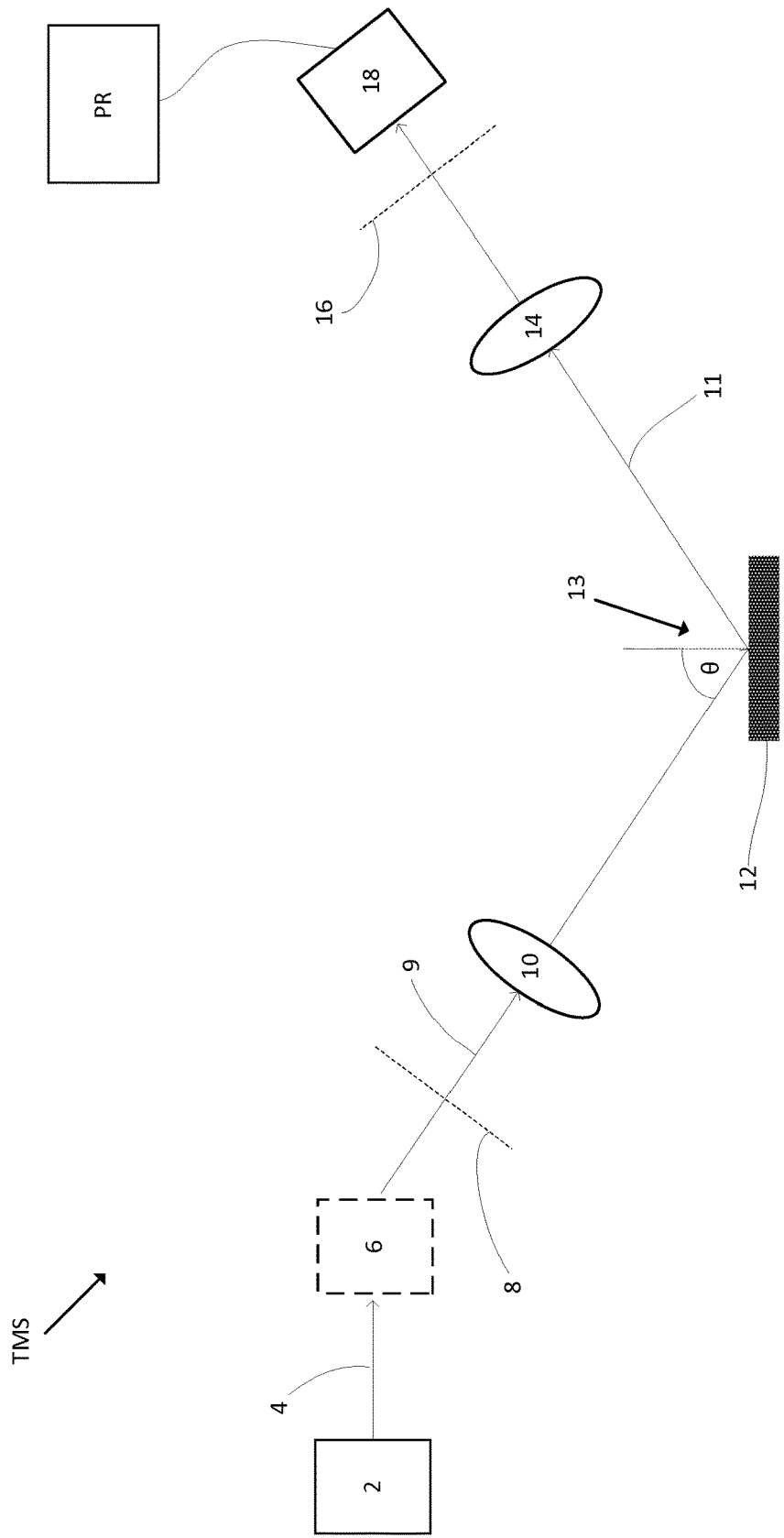
FIG. 2 is a schematic diagram of a conventional topography measurement system.

FIG. 2 is a schematic diagram of a topography measurement system TMS. During topography measurement, a radiation source 2 generates a radiation beam 4. Optics 6 may be provided to direct and/or focus the radiation beam 4. The radiation beam 4 is incident on a grating 8. The radiation beam 4 is patterned with an image of the grating 8 on passing through the grating. The patterned radiation beam may be referred to as a measurement beam 9 (or equivalently a measurement radiation beam).

The measurement beam 9 passes through optics 10 that are configured to form an image of the grating 8 on a target location on a substrate 12. The measurement beam 9 is incident upon the substrate at an angle of incidence θ. The grating image is formed at the location indicated by arrow 13. The measurement beam 9 is reflected from the substrate and passes through detection optics 14. The detection optics 14 are configured to receive the reflected measurement beam 11 and form an image of the grating image 13. This image of the grating image is formed at a second grating 16. A detector 18 is configured to receive radiation transmitted through the second grating 16. The detector 18 detects the intensity of radiation incident upon it and produces an output signal that is indicative of the intensity of the radiation. The detector 18 may for example be a photodiode. The detector 18 may for example be a CCD array whereby the detected radiation intensity is integrated across all pixels. In general, any detector that provides an output signal indicative of the intensity of radiation incident upon the detector may be used.

As the substrate 12 is scanned underneath the grating image 13, changes in the height of the substrate result in the image of the grating image 13 moving up and down at the second grating 16. This shift in position of the image of the grating image 13 causes the amount of radiation transmitted by the second grating 16 to change. A change in the amount of radiation transmitted by the second grating 16 in turn changes the intensity of radiation incident upon the detector 18. Thus, the signal output from the detector 18 is indicative of the height of the substrate 12. The signal output from the detector 18 may be analyzed by a processor PR to generate a map of the topography of the substrate 12.

The grating may comprise a one dimensional grating structure. The grating may comprise a two dimensional grating structure such as, for example, a checkerboard pattern. In general, any grating structure may be used. However, only spatial resolution in one dimension is required as the shift in the position of the image of the grating image that results from the changing substrate height only occurs in one dimension.

Multiple radiation sources may be used to produce multiple radiation beams which may then pass through multiple illumination optics and illuminate multiple target locations on the substrate 12. Using multiple radiation beams allows the substrate to be scanned in fewer strokes, and this allows the substrate's topography to be determined with greater speed.

A substrate will be provided with a plurality of patterned layers in order, for example, to create a multi-layer IC. Each layer is formed by projecting a patterned layer to expose resist on the substrate and then processing the substrate. The processing may for example comprise etching the resist, depositing material into recesses formed by the etching, and then polishing the substrate. This forms a layer of patterned material on the substrate. The thickness of the layer will depend upon the processing that is performed, and will vary from layer to layer. A set of patterned layers on a substrate may be referred to as a stack. A lithographic apparatus should be capable of projecting patterns onto substrates with stacks of widely varying compositions. The topography measurement system TMS should be capable of measuring substrate topography for all expected stack compositions.

When the measurement beam 9 is incident upon the substrate 12 during topography measurement, a portion of the measurement beam penetrates the surface of the substrate and is reflected from interfaces between different layers of the substrate stack. Interference effects will be caused by this reflection of the measurement beam 9 from different layers of the stack. The interference effects distort the wavefront of the reflected measurement beam 11. This in turn shifts the position at the second grating 16 of the image of the grating image 13. The shift of the image of the grating image 13 caused by stack interference effects decreases the accuracy with which the topography of the substrate is measured. Different polarizations of radiation may experience different phase shifts when reflecting from interfaces between different layers of a substrate stack. Different polarizations of radiation may reflect by different amounts when reflecting from interfaces between different layers of a substrate stack. The decrease in accuracy of topography measurements caused by stack interference effects may be different for different polarizations of radiation.

The depth to which the measurement beam 9 penetrates the surface of the substrate 12 before being reflected depends on both the wavelength and the angle of incidence of the measurement beam. In general, the penetration depth of the measurement beam 9 decreases for decreasing wavelengths and decreases for increasing angles of incidence θ. Broadband radiation may be utilized to increase the accuracy of topography measurements, since the interference effects caused by reflections from different stack layers may approximately average out across a range of radiation wavelengths. Broadband ultraviolet radiation with wavelengths in the range 225-400 nm may, for example, be used for performing topography measurements. However, even when such broadband radiation is used interference effects may still introduce an undesirable level of errors into topography measurements. The intensity of the radiation may be sufficiently low that it does not expose resist on the substrate.

The uncertainties introduced to the topography measurement by stack interference effects may be referred to as process dependent errors. It is desirable to reduce these process dependent errors. Doing so will make the topography measurement system more robust to substrate stack variations.

Figure 3:
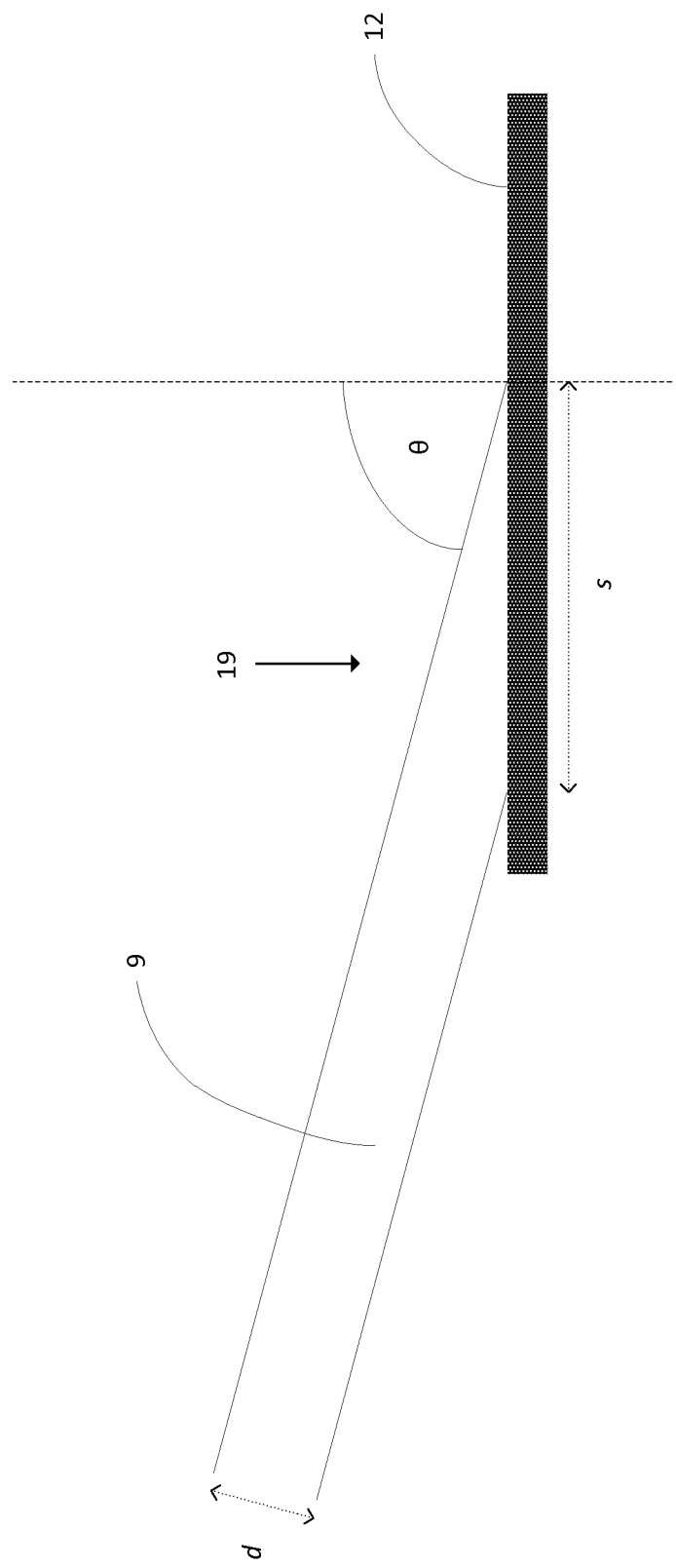
FIG. 3 schematically depicts a measurement radiation beam incident upon a target location of a substrate at an angle of incidence.

One method of reducing the impact of process dependent errors involves increasing the angle of incidence of the measurement beam 9 incident upon the substrate 12. FIG. 3 schematically depicts a measurement beam 9 incident upon a target location of a substrate 12 at an angle of incidence θ. The measurement beam 9 illuminates the target location 19. The measurement beam 9 has width d. The size s of the illuminated target location 19 on the substrate 12 is calculated according to the equation $s = d/\cos\theta$.

The angle of incidence θ used in conventional topography measurement systems is typically 70°. Increasing the angle of incidence decreases the penetration depth of the measurement beam 9 into the substrate 12 sub-structure. This means that fewer stack reflections occur and their associated interference effects in the reflected measurement beam are avoided or reduced. By avoiding or reducing the interference effects caused by different stack reflections, the process dependent errors of the topography measurement are reduced and the accuracy of the topography measurement system is increased. The angle of incidence θ may be increased so that it is greater than 70°. The angle of incidence θ may be between 75° and 85°. The angle of incidence θ may be, for example, around 80°.

Increasing the angle of incidence θ from 70° to around 80° causes the reflectance of radiation from the substrate 12 surface to approximately double. That is, the intensity of radiation reflected from the substrate 12 approximately doubles.

Increasing the angle of incidence θ from 70° to around 80° causes the size s of the illuminated target location 19 to approximately double. When topography measurements are performed, the height profile of the substrate is convolved with the illuminated target location 19. Doubling the illuminated target location 19 thus reduces the spatial sampling rate of the topography measurement system.

One method of improving the spatial sampling rate involves providing a polarizing grating that polarizes radiation passing through it such that the grating image formed on the substrate consists of two polarizations. These two polarizations may, for example, be mutually orthogonal.

Figure 4:
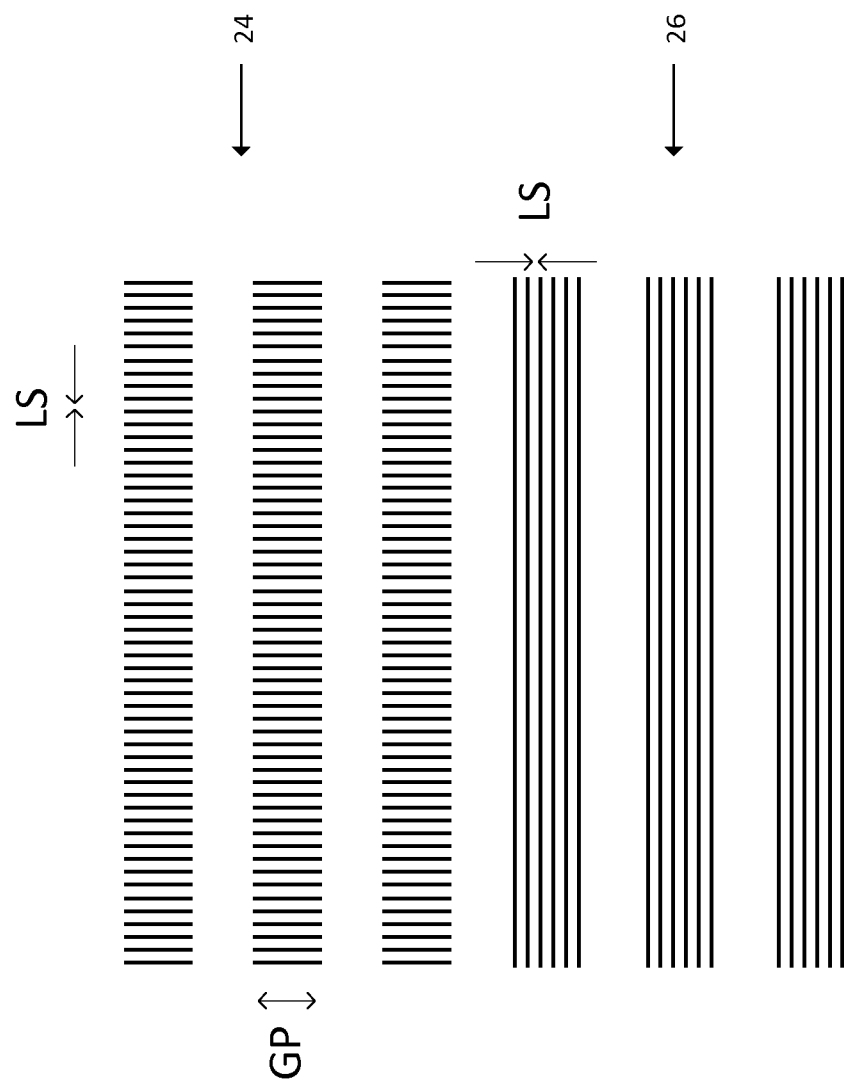
FIG. 4 schematically depicts schematically depicts a wire grid polarizer which may be used as a grating in an embodiment of the invention.

FIG. 4 schematically depicts part of a wire grid polarizer which may be used as a polarizing grating in a particular embodiment. The wire grid polarizer shown in FIG. 4 has a grating period GP and a line spacing LS, and consists of two mutually orthogonal polarizing sections 24, 26. The mutually orthogonal polarizing sections 24, 26 of the wire grid polarizer depicted in FIG. 10 are substantially equal in area. The mutually orthogonal polarizing sections may have different areas. A mathematical weighting may be applied to each mutually orthogonal polarizing section in order to account for a difference between the areas of the mutually orthogonal polarizing sections.

The line spacing LS (i.e. separation between lines) is selected to polarize radiation incident upon the wire grid i.e. the line spacing LS is less than the wavelength of the measurement radiation beam. For example, the line spacing LS may be 60 nm. The line spacing may be less than this, for example as low as 30 nm or 20 nm, although implementing such a small line spacing may be expensive to achieve.

The grating period GP is selected to image the grating 8 on the substrate 12. The grating period may depend on the numerical aperture of the topography measurement system TMS. The grating period GP may, for example, be between 15-50 μm. The grating period GP may, for example, be 30 μm.

The wire grid polarizer may be fabricated using any materials suitable for polarizing high frequency radiation such as, for example, Aluminium, Iridium or Chrome provided on a quartz substrate. The height of the lines may, for example, be between 50-200 nm. The height of the lines may, for example, be around 100 nm.

The wire grid polarizer transmits radiation with a polarization direction perpendicular to the wires, and blocks radiation with a polarization direction parallel to the wires (the radiation is absorbed). A first polarizing section 24 of the wire grid polarizer shown in FIG. 4 transmits a first polarization whilst the other polarizing section 26 transmits a second polarization which is orthogonal to the first polarization. This means that the image of the grating is polarized by the wire grid, with one half of the image consisting of radiation with a first polarization and the other half of the image consisting of radiation with a second polarization that is orthogonal to the first polarization.

Figure 5:
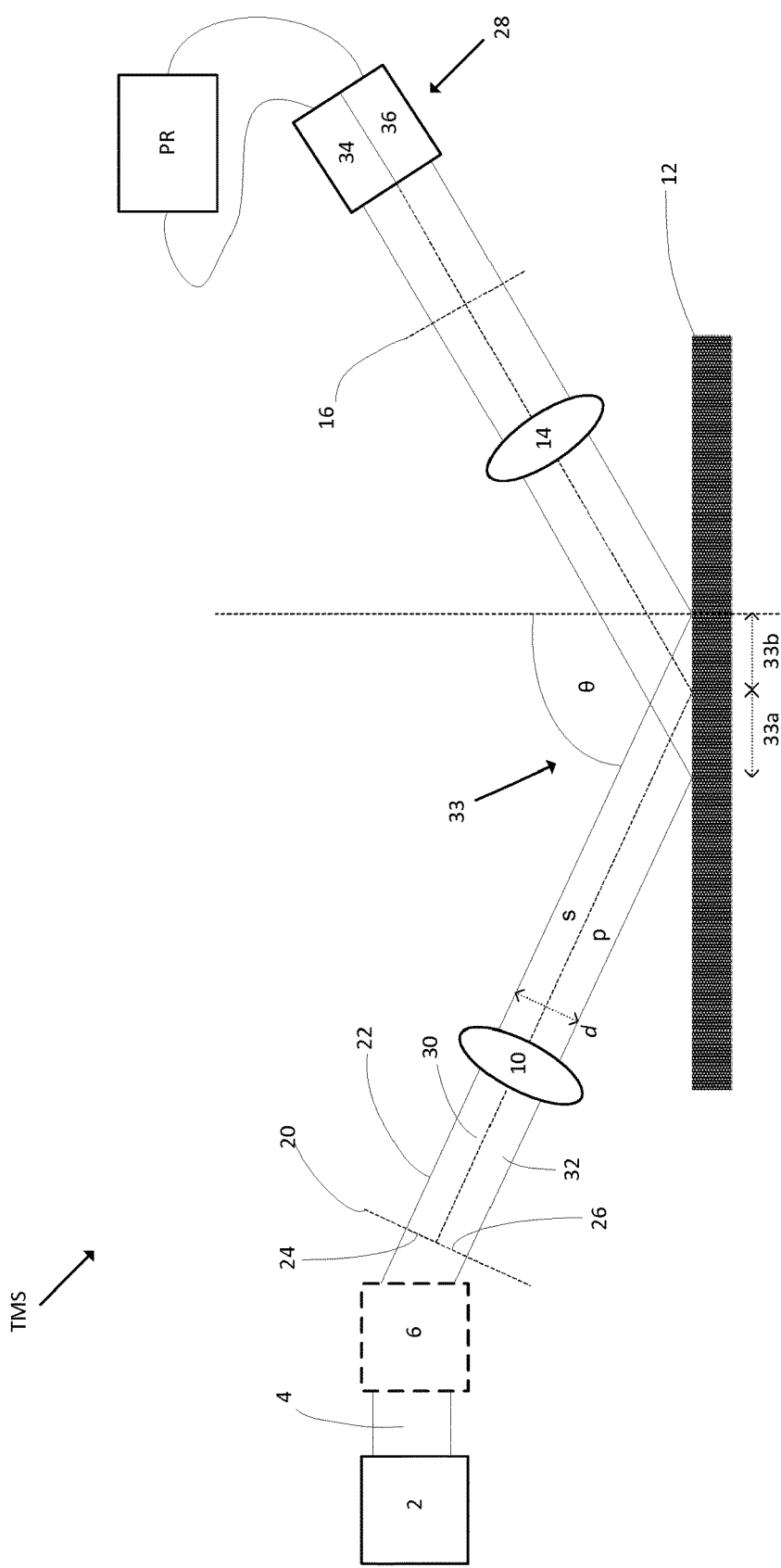
FIG. 5 schematically depicts a topography measurement system according to an embodiment of the invention comprising a wire grid polarizer and a detector comprising two independent regions.

FIG. 5 schematically depicts a topography measurement system TMS according to an embodiment of the invention. The topography measurement system TMS comprises a wire grid polarizer 20 with first and second polarizing sections 24, 26, and further comprises a detector 28 comprising two independent regions 34 and 36. A radiation source 2 produces a radiation beam 4 that passes through the wire grid polarizer 20 of FIG. 4 to form a polarized measurement beam 22. The radiation beam 4 may pass through optics 6 before being incident upon the wire grid polarizer 20. The polarized measurement beam 22 passes through optics 10 that are configured to form an image of the grating 20 at a target location on a substrate 12. The image is at the location indicated by arrow 33.

The polarized measurement beam 22 is incident upon the substrate 12 at an angle of incidence θ (which may for example be between 75° and 85°, and may for example be around 80°). The polarized measurement beam 22 has width d and consists of two mutually orthogonal polarized halves 30 and 32. One half 30 consists of radiation with a first polarization (e.g. p-polarisation) and the other half 32 consists of radiation with a second polarization (e.g. s-polarisation) which is orthogonal to the first polarization. The polarized measurement beam 22 forms a grating image 33 on the substrate 12. Half of the grating image 33a is p-polarised and the other half 33b is s-polarised. The measurement beam 22 is reflected from the substrate 12 and is directed through detection optics 14 which form an image of the grating image 33 at a second grating 16. The second grating 16 is not a polarizing grating. However the invention would work in the same way if the second grating was a polarizing grating, provided that it was polarized in the same direction as the radiation incident upon it. If the second grating was a polarizing grating that was polarized orthogonally to the polarization direction of radiation incident upon the second grating then all of the incident radiation would be blocked by the second grating. The second grating may, for example, comprise a typical saw-tooth grating pattern.

The two independent regions 34, 36 of the detector 28 are configured such that one region 34 receives radiation 32 transmitted through one polarizing section 26 of the wire grid polarizer 20 and the other detector section 36 receives radiation 30 transmitted through the other polarizing section 24 of the wire grid polarizer. Each polarization is thus detected independently. One region of the detector 34 sees the p-polarised half 33a of the grating image 33, and the other region of the detector 36 sees the s-polarised half 33b of the grating image.

Each independent region 34, 36 of the detector 28 produces its own independent output signal indicative of the intensity of radiation incident upon it. As the substrate 12 is scanned during topography measurement, the detector 28 provides two independent output signals for each illuminated location on the substrate. One output signal relates to the first polarization 30 and the other output signal relates to the second polarization 32. The independent signals may be provided to a processor PR configured to analyze the independent output signals and determine the topography of the substrate 12 from the independent output signals.

The detector 28 may for example comprise a photodiode with two independent detector regions 34, 36. The detector 28 may for example comprise a CCD with two independent detector regions 34, 36 whereby the detected intensities are integrated across all of the pixels of each independent detector region 34, 36 separately. In general, any detector that produces two independent output signals, the first indicative of the intensity of a first polarization 30 and the second indicative of the intensity of a second polarization 32, may be used.

The detector 28 may comprise two independent regions which are such that the detector acts as two independent detectors (as described above). Alternatively, two detectors may be used, a first detector receiving radiation which has passed through one polarizing section of the wire grid and a second detector receiving radiation which has passed through the other polarizing section of the wire grid. Each detector may provide its own independent output signal.

As mentioned earlier, if the angle of incidence of the measurement beam is increased from 70° to 80° the size of the illuminated location on the substrate 12 doubles. Doubling the size of the illuminated location would reduce the spatial sampling rate of the topography measurement system TMS. However, the grating image 33 is split into two grating images 33a, 33b that are half the size of the general grating image 33. This means that a reduced spatial sampling rate associated with increasing the angle of incident is avoided.

As mentioned further above, when the angle of incidence is increased from 70° to around 80° an increase of reflectance of the substrate 12 is seen. The reflectance approximately doubles. As a result of the increased reflectance, although each detector region 34, 36 is seeing only half of the measurement radiation beam 30, the intensity of radiation incident upon each detector region is not significantly reduced.

Multiple radiation sources 2 and gratings 8 may be used to produce multiple measurement radiation beams 9 which may then pass through multiple illumination optics 10 and illuminate multiple target locations on the substrate 12. Multiple detectors and multiple second gratings may be used to detect the measurement radiation beams and provide output signals. The processor PR may receive the output signals and convert these into substrate height measurements. Using multiple measurement radiation beams in this manner is advantageous because it allows a height map to be generated for the substrate 12 more quickly (it allows the substrate to be scanned in fewer strokes).

The polarization ratio of a radiation beam may be defined as the amount of radiation with a first polarization relative to the amount of radiation with a second polarization in the measurement beam. Varying characteristics between the optics used for different measurement beams (e.g. different coating thicknesses on mirrors or different angles of incidence on different mirrors) will result in different measurement beams having differing polarization ratios. The variation of polarization ratios between measurement beams will result in different substrate heights being measured by the topography measurement apparatus for the same illuminated location on a substrate. That is, different measurement beams produce non-uniform topography measurement results when measuring the same target location on a substrate. It may be desirable to reduce this variation between measurements. This may be referred to as improving spot-to-spot uniformity.

In an embodiment of the invention, because the detector 28 of the topography measurement system TMS detects each polarization independently, the differing polarization ratios of different measurement beams caused by differing optics characteristics may be measured and accounted for. Since each polarization is detected independently, the spot-to-spot non-uniformity which arises from differing polarization ratios in different measurement beams may be reduced. That is, spot-to-spot uniformity may be improved.

One method of accounting for the differing polarization ratios between different measurement beams involves illuminating a calibration substrate with the measurement beams and measuring the amount of radiation with the first polarization and the amount of radiation with the second polarization that is reflected from the calibration substrate. These calibration measurements may be used to determine adjustments for use during subsequent topography measurements. The adjustments may be adjustments of the magnitude of signals output from the independent regions 34, 36 of the detector 28. In this way spot-to-spot uniformity may be improved.

The processor PR may use the results of calibration measurements to adjust output signals received from the independent regions 34, 36 of the detector 28. Mathematical weights may be assigned to the first and second polarizations for each measurement beam once the calibration measurements have been made. The assigned mathematical weights may then be implemented in formulae to match the detected signals between different measurement beams incident on the same target location of the calibration substrate. The assigned mathematical weights may be used to correct for a polarization imbalance present between different measurement beams. For example, any polarization ratio imbalance present between different measurement beams when incident on the same calibration substrate location may be corrected for once independent measurements of the first and second polarizations have been made for each measurement beam.

The calibration substrate may be any surface that reflects polarized radiation. The calibration substrate may, for example, be a wafer that has multiple independent areas across its surface that comprise deposited layers of different thicknesses. For example, the calibration substrate may comprise multiple independent areas of Silicon oxide layers. The independent areas on the wafer may have differing thicknesses of Silicon oxide layers ranging between 100 nm-2 μm. By illuminating each independent area of the wafer with a measurement beam and measuring and analyzing the amount of radiation of each polarization reflected from the independent areas of the wafer, the polarization ratio of the measurement beam may be determined.

Different polarizations of radiation may produce different process dependent errors when used for topography measurements. For example, using a large amount of radiation with a first polarization and a smaller amount of radiation with a second polarization during topography measurement of a particular substrate may reduce the process dependent error associated with that substrate. It may be desirable to adjust the polarization ratio of a detected measurement beam (or beams) used by the processor PR for topography calculations (e.g. using mathematical weights) so that the process dependent error associated with the topography measurement of a particular substrate is reduced.

Figure 6A:
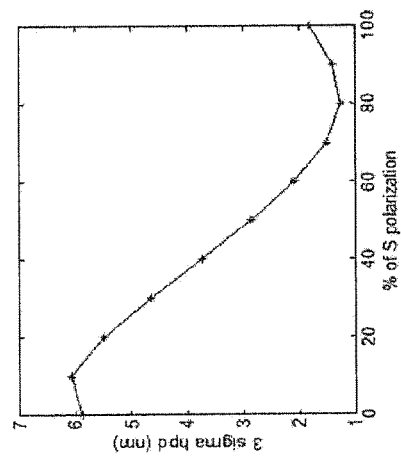
FIGS. 6(a)-6(c) depict the result of three simulations that show how the process dependent error associated with topography measurements varies as the polarization ratio of the measurement radiation beam is altered for three different stacks.
Figure 6B:
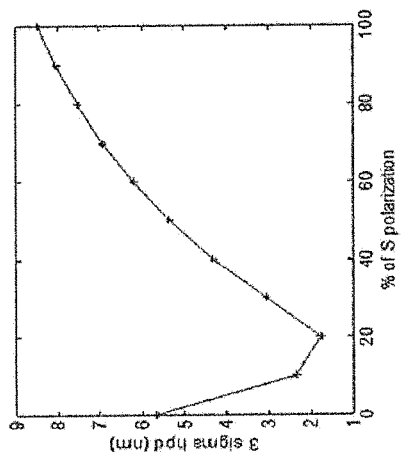
Figure 6C:
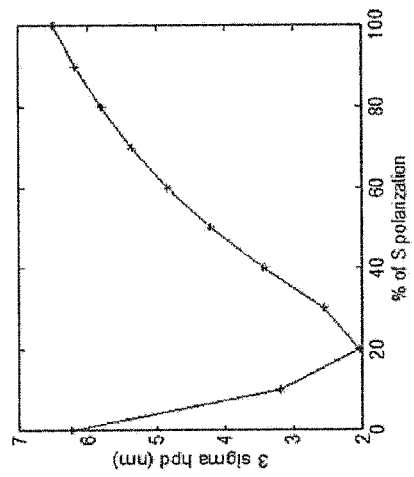

FIG. 6 depicts the results of three simulations a), b), and c) that show how the process dependent error associated with topography measurements varies as the polarization ratio of the measurement radiation beam is altered for three different stacks. Each stack comprised layers of photoresist, antireflection coating, hardmask, oxides, nitrides, metal, polysilicon and silicon. The thicknesses of the layers were varied in the simulation in order to produce the three graphs a), b) and c). For example, the stack represented by b) had the thickest oxide layer of all three stacks, whereas the stack represented by c) had the thickest photoresist layer of all three stacks. The y axis of each graph is three times the standard deviation of the process dependent error ("3 sigma hpd") of a topography measurement performed by the topography measurement system TMS. The x axis of each graph is the percentage of s-polarized radiation present in the measurement radiation beam. The amount of p-polarized radiation present in the measurement radiation beam is the remaining percentage of radiation that is not s-polarized radiation. That is, the x axis of each graph defines the polarization ratio (indicated by the percentage of s-polarized radiation relative to p-polarized radiation) of the measurement radiation beam. As can be seen across all three graphs, variation of the polarization ratio of the measurement radiation beam changes the process dependent error associated with a topography measurement. The simulation results of the stack depicted by b) show that the lowest process dependent error was achieved when the percentage of s-polarized radiation in the measurement radiation beam was 80%. The simulation results of the stack depicted by c) show that the lowest process dependent error was achieved when the percentage of s-polarized radiation in the measurement radiation beam was 20%. Adjusting a polarization ratio of a detected measurement beam for a particular stack may reduce the process dependent error associated with the topography measurement of that particular stack. In general, different polarization ratios are required to achieve a reduced process dependent error for different stacks.

Mathematical weighting may be used by the processor PR to adjust the polarization ratio of the measurement beam following independent measurements of first and second polarized parts of a measurement beam. The polarization ratio of the measurement beam used by the processor PR may be adjusted in order to reduce the associated uncertainty with its output signal e.g. to reduce process dependent errors. For example, if a greater uncertainty was measured for radiation with a first polarization than for radiation with a second polarization reflecting from a particular substrate, then the first polarization may be assigned a smaller mathematical weight than the second polarization. The mathematical weight reduces the uncertainty associated with the calculated substrate topography.

A mathematical process of determining the topography of a substrate using the conventional topography measurement system TMS depicted in FIG. 2 may be represented by the following equation:

$$h = \frac{P}{8\sin\theta} \times \frac{\sum R(\lambda) \cdot \frac{\partial \varphi}{\partial \theta}(\lambda) \cdot S(\lambda)}{\sum R(\lambda) \cdot S(\lambda)}$$

Where:
h is a height of the substrate measured by the topography measurement system;
P is the pitch of the grating 8;
θ is the angle of incidence of the measurement beam 9;
λ is a wavelength of radiation present in the measurement beam 9;
$R(\lambda)$ is a reflection coefficient of the substrate 12 as a function of the wavelengths of radiation present in the measurement beam 9;

φ is a phase of radiation present in the measurement beam 9;

$$\frac{\partial \varphi}{\partial \theta}$$

(λ) is a variation of angle of incidence as a function of the wavelengths of radiation present in the measurement beam 9; and
$S(\lambda)$ is a spectral content of radiation present in the measurement beam 9 as a function of the wavelengths of radiation present in the measurement beam.

The grating 8 causes diffraction of the radiation beam 4 passing through it. As a result of the diffraction, the measurement beam 9 consists of multiple orders of diffracted radiation. The optics 10 recombines the orders of diffracted radiation to form an image of the grating 8 on the substrate 12. Each diffraction order may have a different angle of incidence θ on the substrate 12. A variation in the angle of incidence ∂θ at the substrate 12 will result in a variation in the phase ∂φ of radiation reflecting from the substrate as the height of the substrate changes. This variation between the angle of incidence θ and the phase φ is represented by the partial derivative $$\frac{\partial \varphi}{\partial \theta}.$$

This partial derivative contains substrate 12 height information.

The summations in equation 1 represent the variables that contribute to the detector output signals. These variables are the reflection coefficient, the spectral content and the variations in angle of incidence with respect to variations in phase experienced by radiation in the measurement beam 9 upon reflection from the substrate 12.

By measuring each polarization of radiation present in the measurement radiation beam independently and determining their associated process dependent errors, appropriate mathematical weights may be subsequently applied to each polarization. Application of the mathematical weights allows for the polarization ratio of the measurement beam to be adjusted. The following example equation demonstrates how the mathematical weights may be applied in order to improve the accuracy of a topography measurement using the topography measurement system TMS depicted in FIG. 5:

$$h' = \frac{P}{8\sin\theta} \times \frac{\sum R_{TE}(\lambda) \cdot \frac{\partial \varphi}{\partial \theta}_{TE}(\lambda) \cdot W_{TE} S_{TE}(\lambda) + \sum R_{TM}(\lambda) \cdot \frac{\partial \varphi}{\partial \theta}_{TM}(\lambda) \cdot W_{TM} S_{TM}(\lambda)}{\sum R_{TE}(\lambda) \cdot W_{TE} S_{TE}(\lambda) + \sum R_{TM}(\lambda) \cdot W_{TM} S_{TM}(\lambda)}$$

Equation 2: Example weighting equation that may be used with a topography measurement system TMS that has two independent detector output signals each representative of a different polarization of radiation.

Where:
h' is a height of the substrate measured by the topography measurement system after mathematical weights have been applied;

TE denotes transverse-electric (or "s") polarized radiation present in the measurement radiation beam 22;

TM denotes transverse-magnetic (or "p") polarized radiation present in the measurement radiation beam 22;

$R_{TE}(\lambda)$ is a reflection coefficient of the substrate 12 for transverse-electric polarized radiation present in the measurement radiation beam 22 as a function of the wavelengths of radiation present in the measurement radiation beam;

$R_{TM}(\lambda)$ is a reflection coefficient of the substrate for transverse-magnetic polarized radiation present in the measurement radiation beam 22 as a function of the wavelengths of radiation present in the measurement radiation beam;

$$\frac{\partial \varphi}{\partial \theta}_{TE}$$

$(\lambda)$ is a variation of phase with variation of angle of incidence for transverse-electric polarized radiation present in the measurement radiation beam 22 as a function of the wavelengths of radiation present in the measurement radiation beam;

$$\frac{\partial \varphi}{\partial \theta}_{TM}$$

$(\lambda)$ is a variation of phase with variation of angle of incidence for transverse-magnetic polarized radiation present in the measurement radiation beam 22 as a function of the wavelengths of radiation present in the measurement radiation beam;

$S_{TE}(\lambda)$ is a spectral content of radiation present in the measurement radiation beam 22 for transverse-electric polarized radiation as a function of the wavelengths of radiation present in the measurement radiation beam; and, $S_{TM}(\lambda)$ is a spectral content of radiation present in the measurement radiation beam 22 for transverse-magnetic polarized radiation as a function of the wavelengths of radiation present in the measurement radiation beam.

$W_{TE}$ is a mathematical weight applied to transverse-electric polarized radiation present in the measurement radiation beam 22; and, $W_{TM}$ is a mathematical weight applied to transverse-magnetic polarized radiation present in the measurement radiation beam 22.

The mathematical weights may be normalized such that:

$$W_{TE} + W_{TM} = 1$$

Equation 3: Example normalization of mathematical weights.

One method of reducing process dependent errors involves making a reference measurement of the topography of a substrate using a method that does not experience process dependent errors. For example, an air gauge may be used to measure the topography of a substrate. An air gauge directs a stream of air onto a surface and then measures the pressure of air reflecting from the surface back towards a pressure sensor on the air gauge. The pressure of this backflow of air is proportional to the distance between the air gauge and the surface. The topography measurements performed using the air gauge do not experience process dependent errors. The topography of the same substrate may then be measured using a measurement radiation beam 22 in the topography measurement system TMS. Differences between the results of the air gauge measurement and the results of the topography measurement system TMS measurement may be used to calibrate that measurement beam for use with the particular stack associated with that substrate. Calibration of the measurement radiation beam 22 may involve adjusting the polarization ratio of the detected measurement radiation beam in order to achieve the same topography measurement result as the air gauge measurement. The air gauge provides accurate measurements of topography but takes a long time to perform the measurement. Multiple measurement radiation beams 22 of a topography measurement apparatus may be calibrated via the use of an air gauge as described above. The calibration measurements may be used during subsequent topography measurements to apply adjustments of the magnitude of signals output from the independent regions 34, 36 of the detector 28.

Although the illustrated embodiment uses a polarizing grating, in other embodiments the grating and polarizer may be provided as separate entities. Thus, a polarizer and grating may be provided as a polarizing grating or as a grating and a separate polarizer. When retrofitting the invention to an existing topography measurement system it may be preferred to use a polarizing grating rather than a separate polarizer and grating because doing so will avoid changing the optical path length of the system (thereby avoiding a possible need to modify the optics of the system). Thus, when retrofitting the invention, an existing conventional grating may be replaced with a polarizing grating.

In described embodiments of the invention the polarized measurement beam consists of first and second mutually orthogonal polarized parts. These form a grating image comprising a first part having a first polarization and a second part having a second orthogonal polarization. However, it is not essential that the first and second parts of the measurement beam have mutually orthogonal polarizations. All that is required is that the first and second parts of the measurement beam have different polarizations. Provided that the angles of the polarizations are known, the resulting detected signals can be mathematically processed to convert them to signals that would have been detected if the first and second parts of the beam had mutually orthogonal polarizations. Using mutually orthogonal polarizations is preferred because it avoids such mathematical processing. In addition, it may be easier to manufacture a polarizing grating which provides orthogonal polarizations than it is to manufacture a polarizing grating which provides non-orthogonal polarizations.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The illumination optics, optics and detection optics may encompass various types of optical components, including refractive, reflective, and catadioptric optical components for directing, shaping, or controlling the beam of radiation.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A topography measurement system comprising:
   a radiation source configured to generate a measurement radiation beam;
   a polarizer and a grating configured to receive the measurement radiation beam and provide a polarized measurement radiation beam patterned by the grating;
   optics configured to form an image of the grating at a target location on a substrate, the grating image comprising a first part having a first polarization and a second part having a second different polarization;
   detection optics configured to receive radiation reflected from the target location of the substrate and form an image of the grating image at a second grating;
   a detector configured to receive radiation transmitted through the second grating and produce a first output signal indicative of the intensity of the transmitted radiation for the first part of the grating image and produce a second output signal indicative of the intensity of the transmitted radiation for the second part of the grating image; and
   a processor configured to analyse the output signals and determine the topography of the substrate from the independent output signals.

2. The topography measurement system of claim 1, wherein the second polarization is orthogonal to the first polarization.

3. The topography measurement system of claim 1, wherein the polarizer and the grating are provided in the form of a polarizing grating.

4. The topography measurement system of claim 1, wherein the polarizing grating comprises a wire grid polarizer.

5. The topography measurement system of claim 4, wherein the wire grid polarizer comprises two mutually orthogonal polarizing sections and wherein the mutually orthogonal polarizing sections are substantially equal in area.

6. The topography measurement system of claim 5, wherein the detector comprises two independent regions configured such that one detector region receives radiation from the first part of the grating image and the other detector region receives radiation from the second part of the grating image.

7. The topography measurement system of claim 1, wherein the first and second output signals are assigned mathematical weights by the processor.

8. The topography measurement system of claim 7, wherein the assigned mathematical weights are used to adjust a polarization ratio of the detected measurement radiation beam.

9. The topography measurement system of claim 7, wherein:
   the measurement radiation beam is one of a plurality of measurement radiation beams, and
   the assigned mathematical weights are used to correct for a polarization imbalance between the measurement radiation beams.

10. A lithographic apparatus comprising:
    an illumination system configured to condition a radiation beam;
    a support constructed to support a patterning device, the patterning device being capable of imparting the radiation beam with a pattern in its cross-section to form a patterned radiation beam;
    a substrate table constructed to hold a substrate;
    a projection system configured to project the patterned radiation beam onto a target portion of the substrate; and
    a topography measurement system comprising:
       a radiation source configured to generate a measurement radiation beam;
       a polarizer and a grating configured to receive the measurement radiation beam and provide a polarized measurement radiation beam patterned by the grating;
       optics configured to form an image of the grating at a target location on a substrate, the grating image comprising a first part having a first polarization and a second part having a second different polarization;
       detection optics configured to receive radiation reflected from the target location of the substrate and form an image of the grating image at a second grating;
       a detector configured to receive radiation transmitted through the second grating and produce a first output signal indicative of the intensity of the transmitted radiation for the first part of the grating image and produce a second output signal indicative of the intensity of the transmitted radiation for the second part of the grating image; and
       a processor configured to analyse the output signals and determine the topography of the substrate from the independent output signals.

11. A topography measurement method comprising:
polarizing and patterning a measurement radiation beam using a polarizer and a grating;
forming an image of the grating on a substrate, the grating image comprising a first part having a first polarization and a second part having a second different polarization;
forming an image of the grating image at a second grating;
detecting the intensity of the first part of the grating image as transmitted by the second grating and detecting the intensity of the second part of the grating image as transmitted by the second grating; and
analysing the detected intensities to determine the topography of the substrate.

12. The topography measurement method of claim 11, wherein the second polarization is orthogonal to the first polarization.

13. The topography measurement method of claim 11, wherein the polarizer and the grating are provided in the form of a polarizing grating.

14. The topography measurement method of claim 11, wherein the detected intensities are assigned mathematical weights and wherein the assigned mathematical weights are used to adjust a polarization ratio of the measurement radiation beam.

15. The topography measurement method of claim 14, wherein:
the measurement radiation beam is one of a plurality of measurement radiation beams, and
the assigned mathematical weights are used to correct for a polarization imbalance present between different measurement radiation beams.

* * * * *